(12) United States Patent
Huang

(10) Patent No.: US 7,073,143 B1
(45) Date of Patent: Jul. 4, 2006

(54) SOLVING CONSTRAINT SATISFIABILITY PROBLEM FOR CIRCUIT DESIGNS

(75) Inventor: Chung-Yang Huang, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 237 days.

(21) Appl. No.: 10/029,596

(22) Filed: Oct. 24, 2001

Related U.S. Application Data

(60) Provisional application No. 60/246,422, filed on Nov. 6, 2000.

(51) Int. Cl.
*G06F 17/50* (2006.01)

(52) U.S. Cl. .................... 716/5; 716/4; 703/14; 703/15

(58) Field of Classification Search .................... 716/5, 716/6, 12, 4; 703/14, 15
See application file for complete search history.

(56) References Cited

U.S. PATENT DOCUMENTS

| 5,276,897 | A |   | 1/1994 | Stalmarck ................... 395/800 |
| 5,937,183 | A |   | 8/1999 | Ashar et al. ........... 395/500.34 |
| 6,035,107 | A | * | 3/2000 | Kuehlmann et al. ........... 716/1 |
| 6,038,392 | A |   | 3/2000 | Ashar et al. ........... 395/500.48 |
| 6,292,916 | B1 | * | 9/2001 | Abramovici et al. ........ 714/736 |
| 6,442,732 | B1 | * | 8/2002 | Abramovici et al. ........... 716/4 |
| 6,975,976 | B1 | * | 12/2005 | Casavant et al. ............. 703/14 |
| 2005/0039077 | A1 | * | 2/2005 | Iyer ............................ 714/25 |
| 2005/0044055 | A1 | * | 2/2005 | Iyer ............................ 706/46 |

OTHER PUBLICATIONS

C-Y Huang et al., Assertion Checking By Combining Word-Level ATPG and Modular Arithmetic Constraint Solving Techniques, Proceedings of the 37th Conference on Design Automation, pp. 118-123, Jun. 2000.*

M. Ganai et al., Enhancing Simulation with BDDs and ATPG, Proceedings of the ACM/IEEE Conference on Design Automation, pp. 385-390, Jun. 1999.*

R. Vemuri et al., Generation of Design Verification Tests from Behavioral VHDL Programs Using Path Enumeration and Constraint Programming, IEEE Transactions on Very Large Scale Integration (VLSI) Systems, pp. 201-214, Jun. 1995.*

Chang-Yang (Ric) Huang, et al.; "Using Word Level ATPG and Modular Arithmetic Constraint-Solving Techniques for Assertion Property Checking"; IEEE Transactions on Computer-Aided Design of Integrated Circuits and Systems, vol. 20, No. 3, Mar. 2001; pp. 381-391.

(Continued)

*Primary Examiner*—A. M. Thompson
(74) *Attorney, Agent, or Firm*—Bingham McCutchen LLP

(57) ABSTRACT

A method for generating a test vector for functional verification of circuits includes providing a representation of a circuit, where the representation includes a control logic component and a datapath logic component. The method also includes reading one or more vector generation targets, and performing word-level ATPG justification on the control logic component to obtain a control logic solution. The method further includes extracting one or more arithmetic functions for the datapath logic component based on the control logic solution, and solving the one or more arithmetic functions using a modular constraint solver. The modular constraint solver is based on a modular number system.

24 Claims, 6 Drawing Sheets

OTHER PUBLICATIONS

Farzan Fallah, et al.; "Functional Vector Generation for HDL models Using Linear Programming and 3-Satisfiability"; Proceedings of 1998 Design Automation Conference; Jun. 15-19, 1998; pp. 528-533.

Ranga Vemuri, et al.; "Generation of Design Verification Tests from Behavioral VHDL Programs Using Path Enumeration and Constraint Programming"; IEEE Transactions on Very Large Scale Integration (VLSI) Systems; vol. 3, No. 2, Jun. 1995; pp. 201-214.

"Murphi Description Language and Automatic Verifier"; http://sprout.stanford.edu/dill/murphi.html; Nov. 7, 2001; pp. 1-6.

Kenneth L. McMillan; "Symbolic Model Checking"; Kluwer Academic Publishers; 1993.

* cited by examiner

| Condition | Implications |
|---|---|
| en = 0 | Out <= all z's |
| en = 1 | Out<=cube_intersect(Out, In)<br>In<=cube_intersect(Out, In) |
| Out has 'z' | en <= 0<br>Out <= all z's |
| Out has '1' or '0' | en <= 1<br>Out<=cube_intersect(Out, In)<br>In<=cube_intersect(Out, In) |

SOLVING CONSTRAINT SATISFIABILITY PROBLEM FOR CIRCUIT DESIGNS

CLAIM FOR PRIORITY

This application claims the benefit of priority under 35 U.S.C. § 119(e) of U.S. Provisional Application No. 60/246,422 filed on Nov. 6, 2000, the entirety of which is incorporated herein by reference.

APPENDICES

Appendix A, which forms a part of this disclosure, provides theoretic details of the modular constraint solver as disclosed herein.

Appendix B, which forms a part of this disclosure, provides an exemplary procedure for solving linear equations that have bit slicing and concatenation operations.

BACKGROUND

1. Field

The present invention relates generally to functional verification of circuit designs and, more particularly, to the generation of verification vectors for use in debugging circuit designs.

2. Description of the Related Art

Verification is typically the most time-consuming component in a circuit design process. Failing to detect functional design errors early in the design stage usually leads to the expensive re-spin of the design process. This re-spin includes diagnosis and correction of the errors, logic and physical re-synthesis, and most important of all, rerunning the functional verification of the design.

Thus far, simulation is the mainstream approach for function verification of circuit designs. Various coverage metrics, for example, hardware description language (HDL)-based code coverage, are used to assess the quality of the verification vectors and determine when to stop the simulation process. A drawback is that the verification vectors are either manually derived by designers or randomly generated from the high-level description of the design and its environment. As a result, verification vectors, for example, for some corner-case bugs, are not easily derived and high coverage is generally hard to achieve.

Deterministic functional vector generation is one technique intended to enhance the aforementioned verification quality. Deterministic functional vector generation can be viewed as a constraint satisfiability problem. Intended circuit behavior is translated as a set of temporal constraints and a design error is found or detected if there exists an input sequence that violates these constraints. However, due to the increasing complexity of modem circuit designs, current constraint satisfiability techniques still suffer from unacceptable capacity and performance problems. For example, typical Automatic Test Pattern Generation (ATPG) and Boolean satisfiability (SAT) engines use branch-and-bound algorithms to search for test vectors in the Boolean space. These techniques can be used to generate counter-examples for the properties of a circuit. However, because the computational complexity of these techniques grows exponentially as the sequentiality of the property increases, these techniques can only handle property checking with limited sequential depth.

In contrast, general arithmetic solvers apply mathematical theorems to analyze the constraints. They treat the signals in a circuit as integers and solve the formulas in the integral or floating point number system. However, since the signal values of the circuit actually operate in the modular number system, solving circuit constraints in the integral or floating point number system may add unnecessary complexity and even lead to invalid solutions.

Finite State Machine (FSM) reachability analysis is another technique intended to enhance the aforementioned verification quality. FSM state traversal techniques treat the design as a finite state machine and the properties as temporal relations between states. In order to assure that no input sequence can violate the properties, a complete state reachability analysis is required. Explicit state enumeration approach is a technique for performing the analysis that uses a hash data structure to record the reached states. Since the number of states grows exponentially as the number of registers increases, the explicit state enumeration technique has the state explosion problem for larger designs.

Symbolic state traversal approach is another technique for performing the reachability analysis. In contrast to the explicit approach, symbolic state traversal approach uses compact data structures such as Binary Decision Diagram (BDD) to compute and record the reached states. In general, symbolic state traversal approach can handle larger designs than the explicit state enumeration approach. However, symbolic state traversal approach still suffers from the state explosion problem for designs with more than approximately one hundred registers. As a result, full chip (whole circuit) functional verification is unattainable using FSM state traversal techniques.

SUMMARY

The present invention provides a system and method for checking assertion properties for register-transfer level (RTL) designs. In one embodiment, structural word-level ATPG is combined with modular arithmetic constraint-solving techniques to solve one or more constraints imposed by one or more target assertion properties on a circuit design. The word-level ATPG and its associated implication technique not only solves the constraints on the circuit's control logic, but also propagates the logic implications to the datapath portion of circuit. An arithmetic constraint solver based on a modular number system then solves the remaining constraints in the datapath.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

In one embodiment, a method for generating a test vector for functional verification of circuits includes: providing a representation of a circuit, the representation having a control logic component and a datapath logic component; reading one or more vector generation targets; performing word-level ATPG justification on the control logic component to obtain a control logic solution; extracting one or more arithmetic functions for the datapath logic component based on the control logic solution; and solving the one or more arithmetic functions using a modular constraint solver, the modular constraint solver being based on a modular number system.

In another embodiment, a method for performing word-level ATPG justification on a target circuit, wherein the target circuit includes one or more control signals, includes: identifying an internal control signal of the target circuit; making a decision on the identified internal control signal; performing word-level implication on circuit components related to the target circuit; determining if a conflict arises from the word-level implication; and determining if the one or more control signals are justified.

In still another embodiment, a method for performing word-level ATPG on a target circuit, wherein the target circuit includes one or more control signals and one or more data signals, includes: performing word-level implication; performing ATPG justification on the control signals of the target circuit; and solving the data signals utilizing a modular constraint solver.

In yet another embodiment, a computer-readable storage medium has stored thereon computer instructions that, when executed by a computer, cause the computer to:
provide a representation of a circuit, the representation including a control logic component and a datapath logic component; read one or more vector generation targets;
perform word-level ATPG justification on the control logic component to obtain a control logic solution; extract one or more arithmetic functions for the datapath logic component based on the control logic solution; and solve the one or more arithmetic functions using a modular constraint solver, the modular constraint solver being based on a modular number system.

In a further embodiment, a computer-readable storage medium has stored thereon computer instructions that, when executed by a computer, cause the computer to: determine a target circuit; identify an internal control signal of the target circuit; make a decision on the identified internal control signal; perform word-level implication on circuit components related to the target circuit; determine if a conflict arises from the word-level implication; and determine if the one or more control signals are justified.

In still a further embodiment, a computer-readable storage medium has stored thereon computer instructions that, when executed by a computer, cause the computer to: determine a target circuit, the target circuit having one or more control signals and one or more data signals; perform word-level implication; perform ATPG justification on the control signals of the target circuit; and solve the data signals utilizing a modular constraint solver.

These and other embodiments of the present invention will also become readily apparent to those skilled in the art from the following detailed description of the embodiments having reference to the attached figures, the invention not being limited to any particular embodiment(s) disclosed.

DETAILED DESCRIPTION

Figure 1:
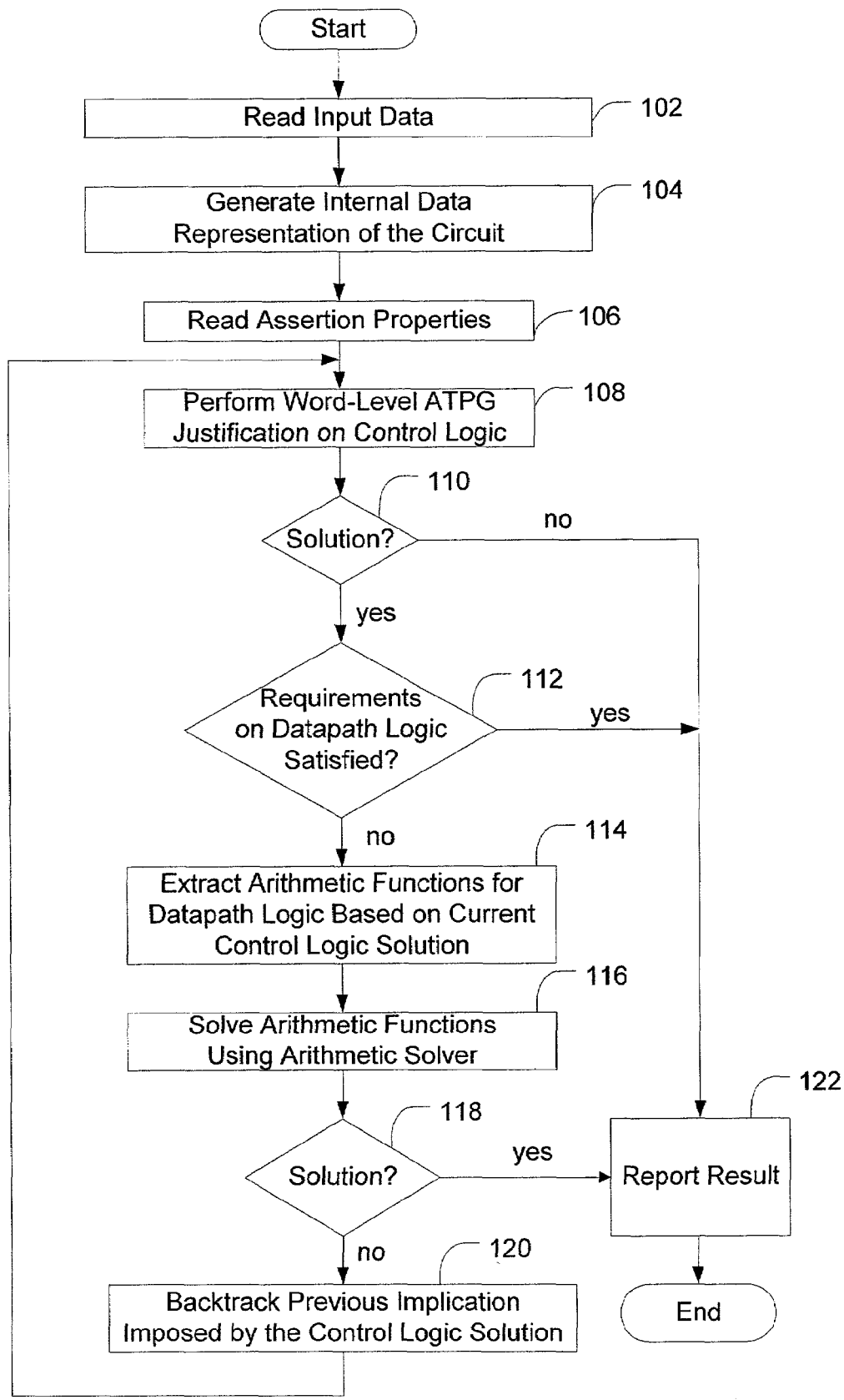
FIG. 1 is a flow chart illustrating an assertion-checking framework, according to one embodiment.

A system and method for checking assertion type properties for RTL design verification is described. In one embodiment, a structural word-level ATPG and a modular arithmetic constraint solver facilitate the checking of assertion properties of circuit designs.

A circuit netlist (RTL netlist) is a netlist of high-level primitives that describes a circuit design. Structural ATPG and modular arithmetic enable better utilization of the high-level RTL information and facilitate word-level implication on both Boolean and arithmetic gates, which, along with other components, are included in the RTL netlist. The implications between the Boolean and arithmetic gates are translated using a technique that enables the detection of conflicting implications at an early state in the implication process.

Structural word-level ATPG utilizes a branch-and-bound process to perform the necessary word-level implication on the appropriate circuit components. The abstract state variables in the extended finite state machine model representation of the circuit serve as good candidates of decision points in the branch-and-bound process. When a search encounters a conflict in an abstract state transition or learns that a transition can lead to a hard-to-reach state, the transition is recorded (e.g., in an appropriate extended state transition graph). The recorded information is then used in subsequent ATPG processes to speed up the search.

The signal values in RTL netlists are represented using finite width bit-vectors. As such, a modular arithmetic constraint solver that solves arithmetic constraints using a modular instead of general integral number system will not miss the solutions that result from the modulation. Thus, use of the modular arithmetic constraint solver avoids the false-negative effect in generating counter examples (is false positive from the perspective of assertion checking).

The preferred embodiments of the present invention and their advantages are better understood by referring to FIGS. 1 through 8 of the drawings. Throughout the drawings, like numerals are used for like and corresponding parts of the various drawings.

Turning first to the nomenclature of the specification, the detailed description that follows is presented largely in terms of processes and symbolic representations of operations performed by conventional computers, including computer components. A computer may be any microprocessor or processor (hereinafter referred to as processor) controlled device such as, by way of example, personal computers, workstations, servers, clients, mini-computers, main-frame computers, laptop computers, a network of one or more computers, mobile computers, portable computers, handheld computers, palm top computers, set top boxes for a TV, interactive televisions, interactive kiosks, personal digital assistants, interactive wireless devices, mobile browsers, or any combination thereof. The computer may possess input devices such as, by way of example, a keyboard, a keypad, a mouse, a microphone, or a touch screen, and output devices such as a computer screen, printer, or a speaker. Additionally, the computer includes memory such as a memory storage device or an addressable storage medium.

The computer may be a uniprocessor or multiprocessor machine. Additionally the computer, and the computer memory, may advantageously contain program logic or other substrate configuration representing data and instructions, which cause the computer to operate in a specific and predefined manner as, described herein. The program logic may advantageously be implemented as one or more modules. The modules may advantageously be configured to reside on the computer memory and execute on the one or more processors. The modules include, but are not limited to, software or hardware components that perform certain tasks. Thus, a module may include, by way of example, components, such as, software components, processes, functions, subroutines, procedures, attributes, class components, task components, object-oriented software components, segments of program code, drivers, firmware, micro-code, circuitry, data, and the like.

The program logic conventionally includes the manipulation of data bits by the processor and the maintenance of these bits within data structures resident in one or more of the memory storage devices. Such data structures impose a physical organization upon the collection of data bits stored within computer memory and represent specific electrical or magnetic elements. These symbolic representations are the means used by those skilled in the art to effectively convey teachings and discoveries to others skilled in the art.

The program logic is generally considered to be a sequence of computer-executed steps. These steps generally require manipulations of physical quantities. Usually, although not necessarily, these quantities take the form of electrical, magnetic, or optical signals capable of being stored, transferred, combined, compared, or otherwise manipulated. It is conventional for those skilled in the art to refer to these signals as bits, values, elements, symbols, characters, text, terms, numbers, records, files, or the like. It should be kept in mind, however, that these and some other terms should be associated with appropriate physical quantities for computer operations, and that these terms are merely conventional labels applied to physical quantities that exist within and during operation of the computer.

The program logic can be maintained or stored on a computer-readable storage medium. The term "computer-readable storage medium" refers to any medium that participates in providing the symbolic representations of operations to a processor for execution. Such media may take many forms, including, without limitation, volatile memory, nonvolatile memory, electronic transmission media, and the like. Volatile memory includes, for example, dynamic memory and cache memory normally present in computers. Nonvolatile memory includes, for example, optical or magnetic disks.

It should be understood that manipulations within the computer are often referred to in terms of adding, comparing, moving, searching, or the like, which are often associated with manual operations performed by a human operator. It is to be understood that no involvement of the human operator may be necessary, or even desirable. The operations described herein are machine operations performed in conjunction with the human operator or user that interacts with the computer or computers.

It should also be understood that the programs, modules, processes, methods, and the like, described herein are but an exemplary implementation and are not related, or limited, to any particular computer, apparatus, or computer language. Rather, various types of general purpose computing machines or devices may be used with programs constructed in accordance with the teachings described herein. Similarly, it may prove advantageous to construct a specialized apparatus to perform the method steps described herein by way of dedicated computer systems with hard-wired logic or programs stored in non-volatile memory, such as, by way of example, read-only memory (ROM).

Assertion-Checking Framework

Referring now to the drawings, FIG. 1 illustrates an assertion-checking framework, according to one embodiment. The assertion-checking framework enables the system and methods of the present invention to perform circuit design verification. The system reads in as input data such as, by way of example, RTL Verilog or very high-speed integrated circuit hardware description language (VHDL) codes, an initialization sequence, and environmental setup information (step 102).

The RTL Verilog or VHDL codes specify a HDL design of a circuit and is provided by a circuit designer. The initialization sequence is applied to derive the set of initial states for the circuit. The environmental setup information defines constraints on the circuit inputs such as clock waveform(s), relations between signals in the circuit, signal characteristics, etc. The circuit designer or other user wanting to verify the circuit design can provide the initialize sequence and environmental setup information for the circuit design.

Figure 2:
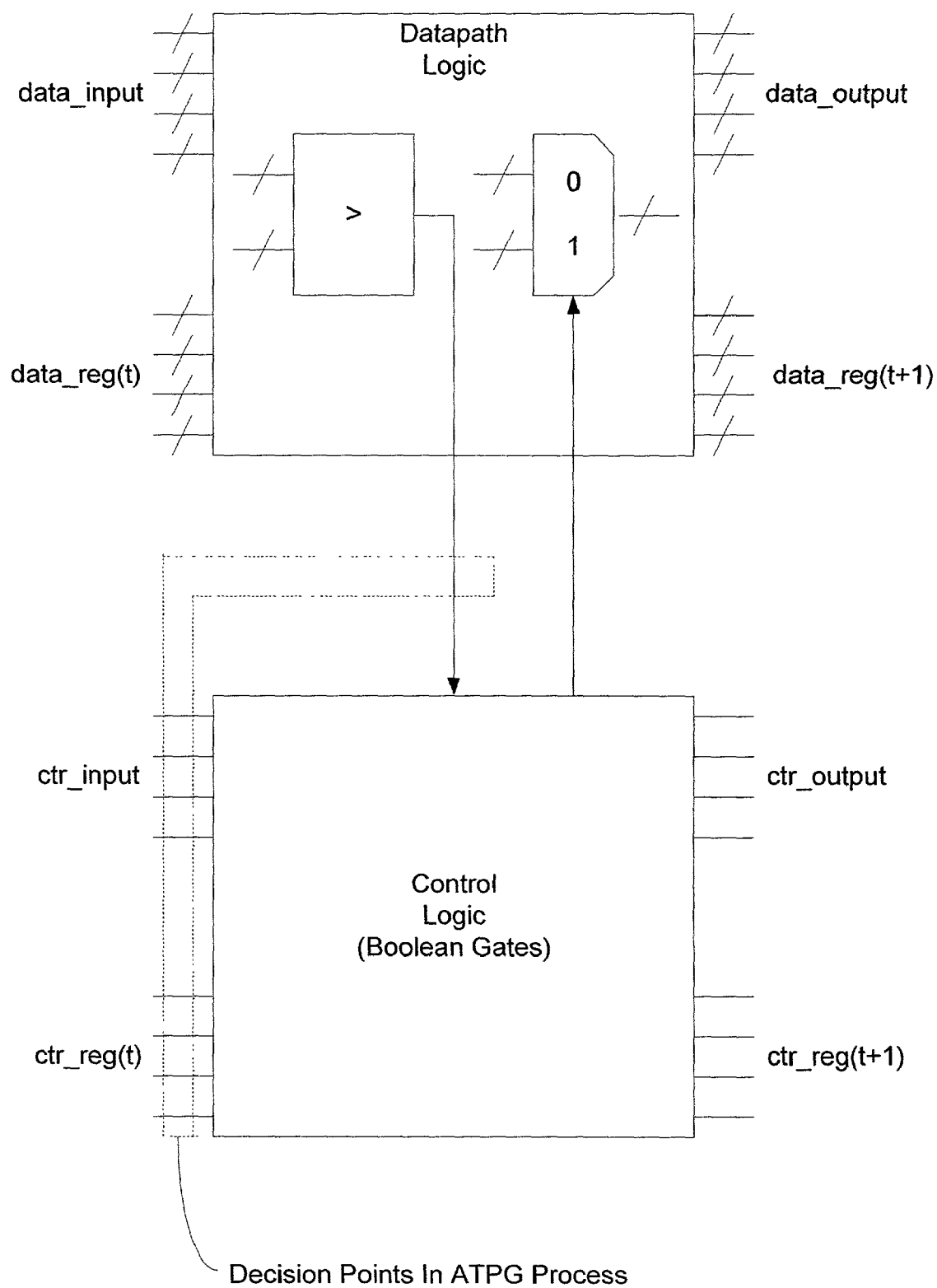
FIG. 2 is a block diagram illustrating a conceptual internal representation of an exemplary circuit.

The system creates an internal data representation of the circuit from the input data (step 104). The system synthesizes/maps the HDL design into a netlist of high-level primitives called an RTL netlist. The RTL netlist includes: boolean gates, arithmetic units, comparators (data-to-control), multiplexers and tristate elements (control-to-data), multiple-driven nets (called bus gates), and memory elements (flip flops and latches). The circuit can then be viewed as an interconnection of control and datapath portions, with some datapath-selecting signals and comparison-output signals functioning as the interface between the control and datapath portions (FIG. 2).

In one embodiment, the system, in order to preserve the original design intent, does not perform logic minimization to optimize the netlist. For example, the internal don't-cares in the circuit design are recorded and represented as functions of module inputs. These don't-care conditions can later be included in the ATPG constraint-solving justification process.

The system reads as input one or more vector generation targets (step 106). The circuit designer can provide the vector generation targets. As used herein, a vector generation target can be considered a circuit condition and can include signals, sequence of signals, and combinations of signals in the circuit. The vector generation targets specify temporal relationships between the signals or signal values and are used to generate the simulation vector(s) needed to exercise the circuit condition specified by the vector generation targets. If a vector generation target is not provided, the system can select a default target (e.g., the system can generate vectors for predetermined signals in the circuit).

In one embodiment, the system formulates the constraints of the target assertion as a linear temporal property, which specifies the expected signal values and relations in an execution sequence. The assertion property is first inverted to produce a counterexample-generation problem and then translated into value requirements in different time frames.

The system then performs word-level ATPG justification on the control logic portion of the circuit (step 108). For example, a constraint solver component of the system applies word-level ATPG techniques to solve the constraints in the boolean domain and propagates the implications to the arithmetic units. The word-level ATPG justification process is further discussed below. If no solution in the controller part can be found (step 110), the system can conclude that no counter example can be generated for this property and, thus, the assertion holds. The system can report the result (step 122) and end processing.

Otherwise, if a solution in the controller part can be found (step 110), the system checks to determine if the requirements on the datapath logic component is satisfied (step 112). If the datapath logic is satisfied, a counterexample is found and the assertion property fails. The system can report the result (step 122) and end processing. Otherwise, the system needs to check the satisfiability of the remaining constraints on the datapath logic. For example, an arithmetic constraint solver component of the system can check the satisfiability of the remaining constraints on the datapath logic.

The datapath circuitry usually includes some arithmetic functions (e.g., addition and subtraction) and relational constraints. The system can combine the functions and constraints in different time frames together by treating the registers as buffers and adding some extra variables. The system then translates the arithmetic functions and constraints into a set of nonlinear and linear equations based on the current control logic solution (step 114).

Having extracted the arithmetic functions for the datapath logic, the system uses the modular arithmetic solver to solve the extracted arithmetic functions (step 116). If a datapath solution exists (step 118), then a counter example is found and the assertion fails. The system can report the result (step 122) and end processing. Otherwise, if a datapath solution does not exist, the system backtracks the previous (i.e., current) implication imposed by the control logic solution during the word-level ATPG justification process (step 120). The system then goes back to the ATPG justification process (step 108) to obtain the next set of solutions for the controller circuit. The system then iterates steps 110 through 118 for the next set of solutions for the controller circuit. This process will continue until the property is proved or the runtime exceeds a preset limit.

Those of ordinary skill in the art will appreciate that, for this and other methods disclosed herein, the functions performed in the exemplary flow charts may be implemented in differing order. Furthermore, steps outlined in the flow charts are only exemplary, and some of the steps may be optional, combined into fewer steps, or expanded into additional steps without detracting from the essence of the invention.

Word-Level ATPG Justification Process

In one embodiment, word-level ATPG justification process utilizes a branch-and-bound process. By making decisions on certain boolean gates, the process tries to justify the target logic assignments, which correspond to the constraints derived from the target verified property. Once an assignment of a decision is made, a complete word-level implication is performed to check the consistency of the constraints in the circuit. If a conflict occurs, conflict analysis is applied to derive the minimal conflict sources and formulate them as a learned constraint so that the same conflict can be avoided.

In one embodiment, the system utilizes three levels of output strength (e.g., strong, weak, and high-impedance "z") to represent the values in an RTL netlist in order to handle the HDL constructs for assertion checking. The weak signals (weak 1 and weak 0) are used for the resistant device that fans out to a bus gate, and the strong signals (strong 1 and strong 0) are applied to all the other gate types and connections. For example, if a bus gate has an rcmos (resistant cmos primitive in Verilog) gate as one of its inputs, then the output of the rcmos gate is treated as a weak signal in the logic implication of this bus gate. In contrast, if the rcmos gate fans out to another type of gate (e.g., an AND gate), then its output is evaluated as a strong signal by this fan-out gate.

The high-impedance "z" value is used for the tristate element output when the enabling signal is off. However, the high-impedance signal is meaningful only for the fan-ins of a bus gate. In other cases (e.g., a high-impedance fan-in of an AND gate), the high-impedance fan-in is treated as an unknown value (i.e., strong 1 or strong 0) "x" for the logic implication.

From the above interpretation, the logic implication of all the gate types except for the bus gate can be operated under three-valued logic (i.e., 1, 0, and unknown "x"). In contrast, the implication of the bus gate can be performed as follows: first, check if any strong fan-in (i.e., the nonresistant gate) of the bus gate is not in the high-impedance state. If there exists a strong fan-in that is driving, this fan-in suppresses the logic implication of the weak fan-ins (i.e., the resistant gates) resulting in the bus gate having a strong output value. On the contrary, if all the strong fan-ins are in the high-impedance state, then the output value of the bus gate is determined by the implication of the weak fan-ins and becomes a weak signal.

Although there are possibly six different kinds of values for a bus gate (i.e., strong 1/0, weak 1/0, high-impedance "z", and unknown "x"), four-valued logic (i.e., 1, 0, "z", and "x") is sufficient for the bus gate implication since the implications of its strong and weak fan-ins are always performed separately. As a result, the system can use a four-valued bit-vector package to represent all the word-level values in the RTL netlist.

Figure 3:
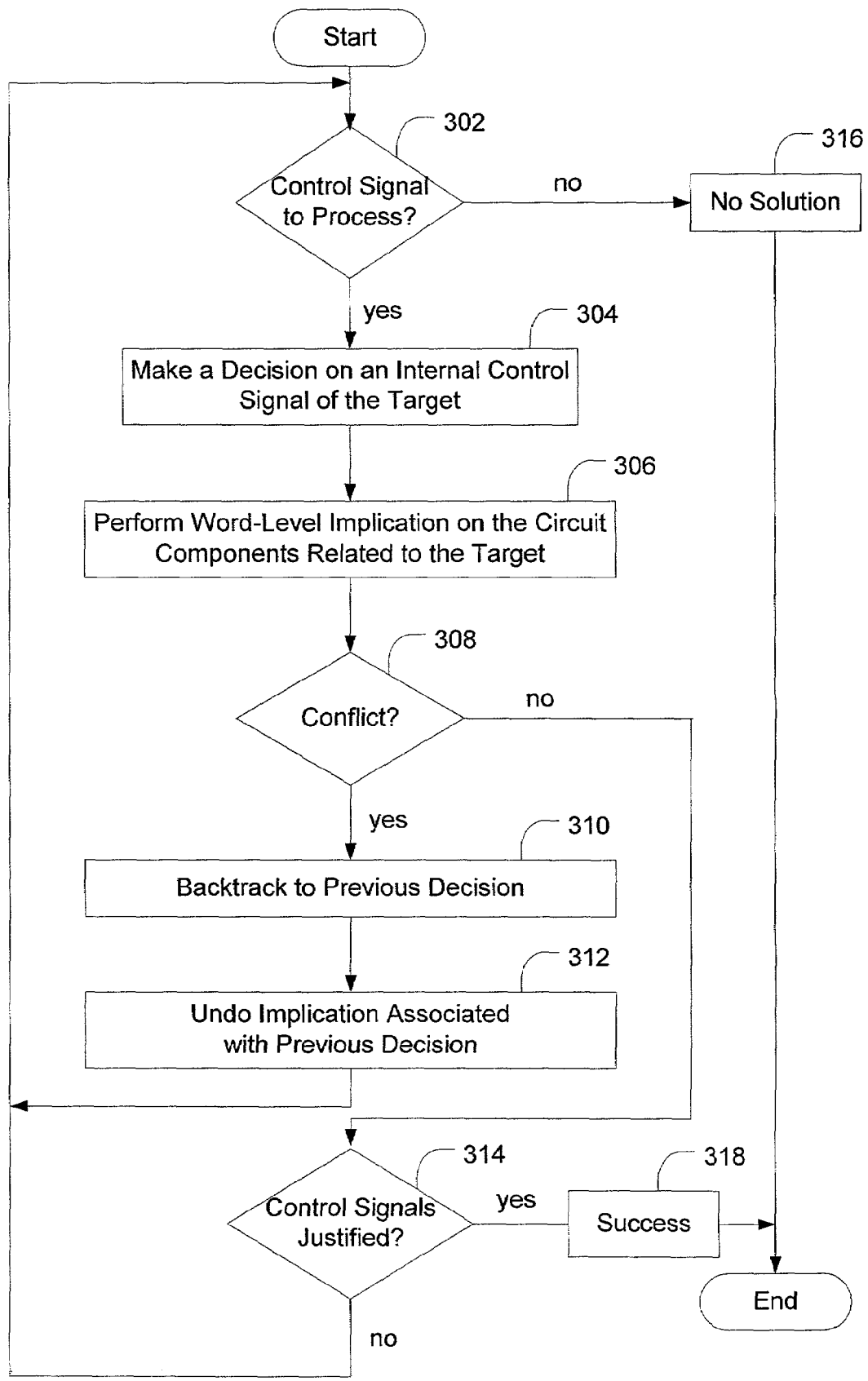
FIG. 3 is a flow chart of an exemplary method for performing word-level ATPG justification on the control logic portion of the circuit, according to one embodiment.

FIG. 3 is a flow chart of an exemplary method for performing word-level ATPG justification on the control logic portion of the circuit, according to one embodiment. Beginning at a start step, the system (i.e., constraint solver component) determines if there is a control signal to process (step 302). If there are no control signals to process (i.e., all applicable control signals have been processed without success), the system can report that no solution was found (step 316), and the word-level ATPG justification process ends. Otherwise, if there is a control signal to process (step 302), the system makes a decision (i.e., control signal='0' or '1') on an internal control signal of the target (step 304).

In one embodiment, the system makes decisions on the control signals and leaves the requirements in the datapath portion unjustified. This reduces the effort of the ATPG process as the enumeration of the potentially enormous number of datapath decision points is avoided. In addition, whenever there is a new decision of assigning a logic value to a single-bit control signal, word-level logic implication is performed to reduce the search space and to detect early contradictions in value assignments.

In one embodiment, after implication, the system checks if there is any unjustified logic gate. The system checks to determine if the logic gate's three-valued simulation value is different from its output implied value or the values of the control flip flops do not cover the initial states. If yes, the boolean constraints are not satisfied and the system performs a justification procedure.

In one embodiment, the justification process begins by backward, breadth-first traversing the circuit from the unjustified gates and stopping at a cut of candidate decision points including control primary inputs (PIs), flip flops, comparator outputs, and multiple fan-out internal logic gates. If the number of decision candidates is too large, using all of them as the decision points may make the decision-making process less efficient. Therefore, if the number of decision candidates exceeds a predetermined limit, based on the number of fan-outs of each candidate, a subset can be selected as the decision nodes.

The decision-making candidate gates are then sorted based on their bias of being assigned "1" or "0" to meet the requirements of the unjustified gates. The observability in general is not a problem in RTL design verification because the system can add watch points (in RTL simulation) wherever necessary. The system backward computes the legal-1/legal-0 probability for the signals between the unjustified and decision-making gates.

Definition 1 (Legal-1/Legal-0 Probability): The legal-1 (legal-0) probability of a signal is the probability of its being assigned to "1" ("0") to satisfy its output logic value.

For example, if a two-input AND gate has output value "0" and both inputs have value "x", then there are three different legal assignments that can satisfy this unjustified value: {(0, 0), (0, 1), (1, 0)}. Therefore, the legal-1 probability for the input signal is ⅓ because only one out of three legal assignments has value "1" for each of the inputs. In contrast, if the two-input AND gate has output value "1", its input legal-1 probability is 1 (100%) since this is the only legal assignment. The summation of legal-1 and legal-0 probabilities is equal to 100%.

The backward legal-1 probability calculation can be generalized as follows:

Rule 1) For signals with Boolean value "1", the legal-1 probability=1(100%). In contrast, for signals with Boolean value "0", the legal-1 probability=0.

Rule2) Suppose the legal-1 and legal-0 probability for a gate output is p1, and p0, and it has an unjustified output value and n unknown inputs (with value "x"). The legal-1 probabilities ($q_1$) for its input is (for different gate types):

INVERTER: $q1=p0$;

AND: $q1=p1+(2^{n-1}-1)/(2^n-1)*p0$;

OR: $q1=(2^{n-1}1)/(2^n-1)*p1$.

Rule 3) The legal-1 probability of a fan-out stem is set to the average of the legal-1 probabilities of its fan-out branches.

In one embodiment, after the legal-1 probabilities of the decision gates are computed, the system calculates their legal assignment bias as:

Definition 2 (Legal Assignment Bias): Let the legal-1 probability of a gate be p1, then its legal assignment bias is:

(p1)/(1−p1) if p1≧0.5; (bias value="1")

(1−p1)/(p1) if p1<0.5; (bias value="0").

The legal assignment bias is always greater or equal to one. Having the legal assignment bias for each decision point, the system can make the decision at the gate with the highest bias first. For the case of proving an assertion property, that is, it is likely that the counter example does not exist or, if it exists, it is hard to find, the system first assigns the complement of the bias value so that the conflicting condition may occur earlier and thus trim down the decision space. In contrast, if the objective is to generate a witness sequence that is likely to exist, the system assigns the bias value (instead of its complement) first.

The system performs word-level implication on the circuit components that are related to the target (step 306). In one embodiment, the system, in addition to the four-valued bit-vector package, utilizes different kinds of data structures to record the learned information for different primitives. This enables forward and backward word-level logic implications not only on boolean gates, but also on arithmetic elements. Moreover, this also facilitates translation of the implications between boolean gates and arithmetic elements.

Figure 5:
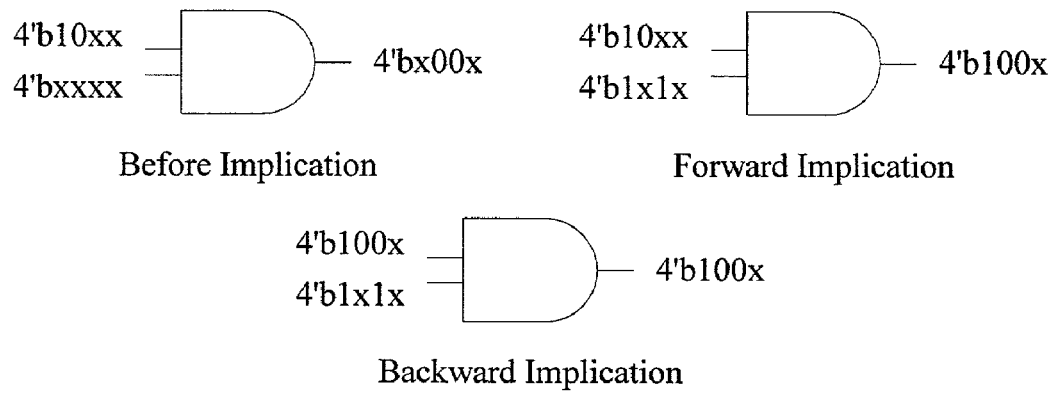
FIG. 5 illustrates a boolean gate implication example.

The implication rules for different kinds of primitives can described as follows:

1) Boolean Gates: The system utilizes three-valued logic encoding (i.e., 0. 1, and unknown 'x') to perform parallel implication for bitwise logic gates. For example, as depicted in FIG. 5, the 4-bit AND gate has input values a=4'b10xx, b=4'bxxxx and output y=4'bx00x. If input b receives the new implication value 4'b1x1x, it will forward imply a new value 4'b100x at output y, which in turn backward implies a new value 4'b100x at input a.

Figure 6:
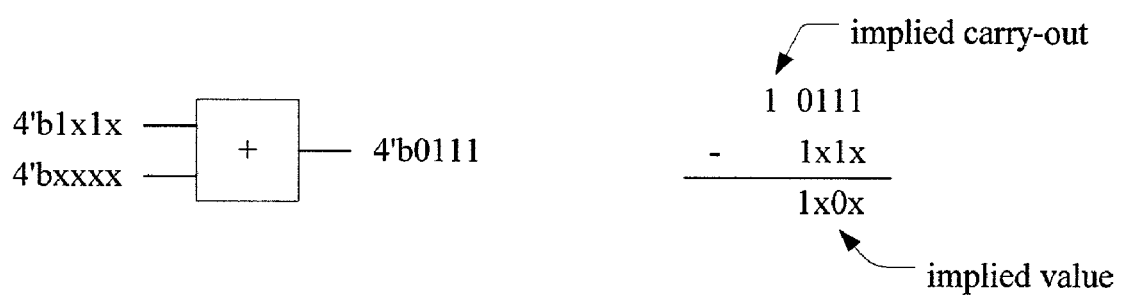
FIG. 6 illustrates an adder circuit implication example.

2) Arithmetic Units: For arithmetic units like adders, the system performs three-valued forward and backward simulation to propagate as much known-value information as possible. For example, as depicted in FIG. 6, if a 4-bit adder has output value 4'b0111 and one of its input has value 4'b1x1x, then by subtracting 4'b1x1x from 4'b0111, the system can learn that the other input must at least have the value 4'b1x0x and the adder must have a carry-out value equal to one. Furthermore, the solutions to a linear arithmetic network can be represented as a closed matrix form: $x=x_0+N*f$, where x is the vector of the input variables, $x_0$ is a particular solution, N is a coefficient matrix, and f is a set of free variables.

Figure 7:
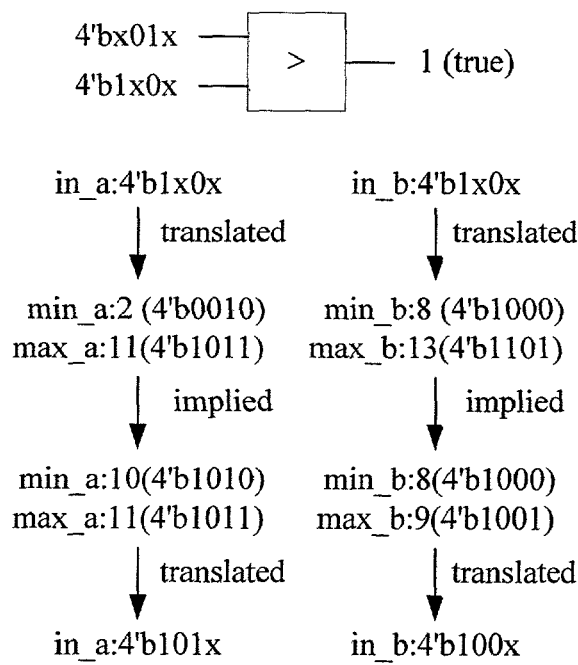
FIG. 7 illustrates a comparator implication example.
Figure 8:
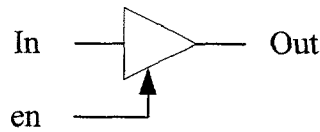
FIG. 8 illustrates a noninverted tristate element implication example.

3) Comparators: The system uses a pair of bit-vectors to record the maximum and minimum values for each of the comparator inputs. For example, as depicted in FIG. 7, suppose a 4-bit "greater" (>) gate has output value 1 (true) and input values "in_a=4'bx01x" and "in_b=4'b1x0x". By setting all the x's to zeros and then to ones, the system can learn that in_a has the minimum and maximum values [min_a, max_a]=[2, 11] and in_b has [min_b, max_b]=[8, 13]. However, for the "greater" gate to be evaluated "true", it implies that min_a must be greater than min_b and max_b must be smaller than max_a. Adjusting the values of min_a and max_b, the system can generate [min_a, max_a]=[9, 11] and [min_b, max_b]=[8, 10]. To map the new ranges back to three-valued logic, the system can use the following rules:

Rule 4) Only bits with value "x" can have new Boolean implications;

Rule 5) More significant bits must have implication prior to less significant ones.

While Rule 4 is trivial in logic implication, Rule 5 is based on the fact that only the most significant "x" bit can divide the original range into two disjoint subranges. In the aforementioned example, implication on the second highest bit of input in b (with original value "4'b1x0x") can split the original range [8, 13] into two distinct subranges [8, 9] (implied "0") and [12, 13] (implied "1"). In contrast, implication on the least significant bit produces two overlapped ranges [8, 12] and [9, 13]. Therefore, to have the new implied range [8, 10], it is mandatory that the second highest bit be implied "0" because this new range [8, 10] has an empty intersection with the other implied range [12, 13] Implication on the least significant bit cannot draw any conclusion on this.

Likewise, the system can learn that the most significant bit of in_a must have implied value "1". Therefore, the new ranges for in_a and in_b will be equal to [10, 11] and [8, 9], respectively. Mapping these new ranges back to three-valued logic generates implications "in_a=4'b101x" and "in_b=4'b100x".

4) Multiplexers: The multiplexer primitive has two data inputs and one selecting signal to choose between these two inputs for the output. If the selecting signal has a known value (i.e., "0" or "1"), the forward and backward implications will act like the buffer primitive which implies the chosen input to the output, and vice versa. In contrast, if the multiplexer has an unknown selecting signal, the system uses the cube union of the input values to derive the implication on the output of this multiplexer. For example, if the inputs of a multiplexer have values 4'b1x10 and 4'b10x0, then by cube union, the output will have the implied value 4'b1xx0. In contrast, if one of its inputs has a null cube intersection with the output, for example, the output has value 4'b1x00 and one of the input has value 4'bx010, then it implies that the selecting signal cannot have the value that selects this input.

5) Tristate Elements: A tristate element is usually used as an input to a multiple-driven net. It contains one (multiple-bit) data input and one or more single-bit controlling signals. When all the controlling inputs are off, the tristate element is in the high-impedance state such that it will have no effect on its fan-out gates. Therefore, any bit of the tristate output in high impedance backward implies that all the controlling signals are off and, thus, forward implies that all the output bits are in a high-impedance state. The implications of a noninverted tristate element is summarized in FIG. 7. As depicted in FIG. 7, all the output bits of the tristate element must have high impedance or known values at the same time. As shown in the third and fourth rows of FIG. 7, whenever the output bas a high-impedance or known-value bit, the enabling signal is implied and, thus, lead to some implications on the data input and output.

6) Registers/Flip Flops: Similarly, the system can derive implications for the asynchronous "set" and "reset" signals of a data register by examining its data input and output values. For example, when the clock input of a register has a positive trigger at the current time, if all the data output bits have been assigned to "O's" and at least one of its input bits has been assigned to "1", the system can learn that the register's "reset" signal must be asserted.

In one embodiment, based on the aforementioned rules, the system can perform logic implication whenever a decision on a boolean gate assignment is made. The system then checks to determine if a conflict occurred during the implication process (step 308). If any conflict occurs during the implication process, the system backtracks to the previous decision (step 310) and undoes the implication associated with the previous decision (step 312). The system identifies the previous decision that created the conflict, marks or records the decision as a bad decision, and undoes the implication associated with the decision.

However, unlike the bit-level logic implication where the single-bit signal can be implied only once (i.e., from "x" to "0" or "1"), a word-level signal can be implied multiple times (e.g., from "4'bxxxx" to "4'bxx01" to "4 b1001"). Therefore, when an implication process returns a conflict and the system backtracks to its previous condition, the system cannot just reset the signals to "x", but needs to recover the signals to their previously partially implied values. Having recovered the signals, the system determines if there is another control signal to process (step 302) and continues processing.

If there is no conflict (step 308), the system determines if all the controls signals are justified (step 314). The system checks to ensure that there are no unjustified boolean gates. If all the control signals are justified, the system successfully produced a vector of the control signals (i.e., PIs are reached and all the constraints on the control logic are satisfied) (step 318), and the word-level ATPG justification process ends. Otherwise, if all the control signals are not justified, the system updates the list of decision points and determines if there is another control signal to process (step 302).

Modular Arithmetic Constraint Solver

In one embodiment, a modular arithmetic constraint solver is based on the modular number system. This is advantageous because the values of the hardware signals are represented as fixed-width bit-vectors. In addition, using modular instead of the general integral arithmetic prevents the false-negative effect. For example, a circuit may include a multiplier with two 3-bit inputs, a and b, and a 4-bit output, c, and the following nonlinear arithmetic constraints describe the multiplier:

$$a*b=c$$

$$0 \leq a,b \leq 8$$

$$0 \leq c < 16$$

Given the initial assignments of "c=12" and "a=4", the solution "b=3" can be easily derived by direct implication. However, "b=7" is also a solution because (4*7) modulo 16=12, as c is a 4-bit signal. Therefore, if the local solution (a, b)=(4, 3) does not satisfy other imposed constraints while (a, b)=(4, 7) does, using a solver/algebra not based on the modular number system results in a false-negative conclusion.

Generally, constraints on datapath can be divided into two types: linear and nonlinear. Nonlinear arithmetic constraints are those derived from multipliers and shifters. Since completely solving the nonlinear constraints can be very difficult, if not impossible, the modular arithmetic constraint solver applies analytical approaches, such as, by way of example, prime number factoring, and the like, to heuristically enumerate the possible solutions and substitute them into the arithmetic equations. Thus, the remaining constraints become linear and can be solved by a linear modular constraint solver component of the modular arithmetic constraint solver.

In contrast, linear constraints correspond to linear arithmetic operators such as adders, subtractors, and multipliers having one constant input. A linear subcircuit with m outputs and n inputs can be transformed to a problem of m. linear equations with n variables. This can be further formulated into a matrix form as A*x=b, where A is an m*n matrix representing the coefficients in the m equations, x is a n*1 column matrix containing the n variables, and b is a m*1 column matrix for the output constraints. Solving the input vectors that can satisfy the output constraints is equal to finding the solution to the matrix equation. The term "column/row matrix" is used instead of "column/row vector" to avoid confusion with the term "bit-vector."

For example, consider a two-input two-output linear circuit with all signals being 3-bit wide. The output constraint is (5, 4) and the circuit under this constraint is transferred into the following matrix format:

$$\begin{bmatrix} 1 & 1 \\ 2 & 7 \end{bmatrix} \cdot \begin{bmatrix} x \\ y \end{bmatrix} = \begin{bmatrix} 5 \\ 4 \end{bmatrix}$$

where x and y are the input signals. Solving it in the integral domain, the linear modular constraint solver component first multiplies the first row by two and subtracts it from the second row. This produces the following matrix format:

$$\begin{bmatrix} 1 & 1 \\ 0 & 5 \end{bmatrix} \cdot \begin{bmatrix} x \\ y \end{bmatrix} = \begin{bmatrix} 5 \\ -6 \end{bmatrix}$$

There is only one nonintegral solution (x, y)=(31/5, −6/5). However, under modulo-$2^3$ number system, a solution (x, y)=(3, 2) can be found. This solution can be derived by calculating the multiplicative inverse of bit-vectors. Additional theoretic details of the linear modular constraint solver component is disclosed in Appendix A.

HDL designs may frequently include bit slicing and concatenation operators. Bit slicing and concatenation transforms the linear operations to nonlinear constraints. That is, the solution set can no longer be expressed in a linear closed form. Thus, the linear modular constraint solver component of the modular arithmetic constraint solver cannot utilize the aforementioned method to solve the linear equations that have bit slicing and concatenation operations. Solving the linear equations that have bit slicing and concatenation operations involve enumerating of some of the variables applying the constraint implication to screen out the illegal set of solutions. A procedure suitable for solving the linear equations that have bit slicing and concatenation operations is disclosed in Appendix B.

Figure 4:
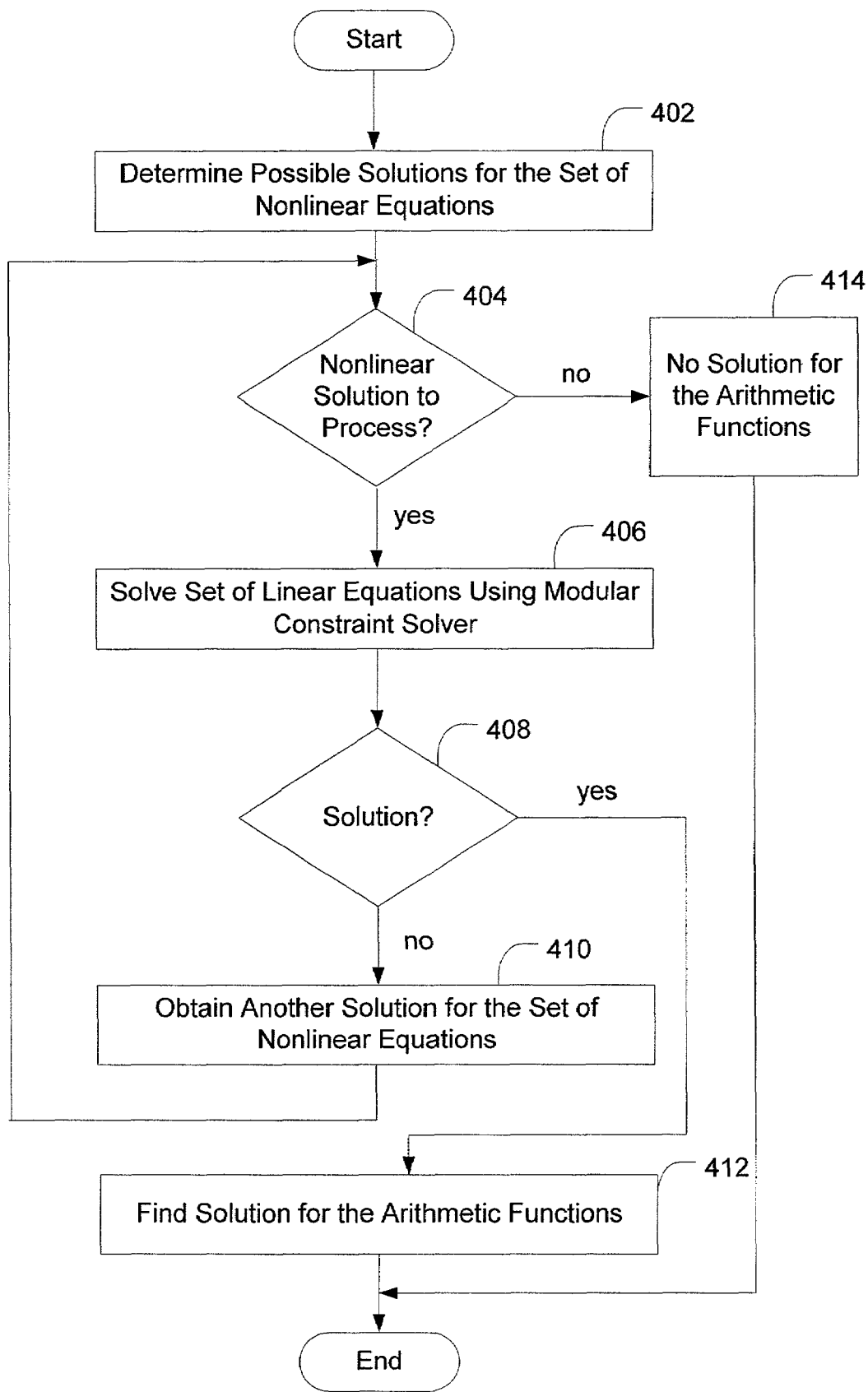
FIG. 4 is a flow chart of an exemplary method for solving the arithmetic functions for the datapath logic portion of the circuit, according to one embodiment.

FIG. 4 is a flow chart of an exemplary method for solving the arithmetic functions for the datapath logic portion of the circuit, according to one embodiment. Beginning at a start step, the modular arithmetic constraint solver determines the possible solutions for the set of nonlinear equations (step 402). The modular arithmetic constraint solver enumerates the possible solutions that have not been processed. If there is a solution that has not been processed, the modular arithmetic constraint solver selects one solution for the set of nonlinear equations from the list of yet-to-be-processed solutions.

The modular arithmetic constraint solver checks to determine if there is a nonlinear solution to process (step 404). If all the possible solutions for the set of nonlinear equations have been processed (i.e., without solving the set of linear equations), the modular arithmetic constraint solver concludes that there is no solution for the arithmetic functions (step 414), and ends processing. Otherwise, if there is a nonlinear solution to process, the modular arithmetic constraint solver solves the set of linear equations using the linear modular constraint solver component (step 406). The linear modular constraint solver component utilizes the current nonlinear solution and the constraints for the linear equations to solve the set of the set of linear equations using the modular number system.

The modular arithmetic constraint solver checks to determine if a solution for the linear equations is found (step 408), If a solution for the linear equations is not found, the modular arithmetic constraint solver selects another solution for the set of nonlinear equations from the list of yet-to-be-processed solutions (step 410), and continues processing steps 404 through 408. Otherwise, if a solution for the linear equations is found, the modular arithmetic constraint solver finds a solution for the arithmetic functions (step 412), and ends processing.

A technical advantage of the present invention includes combining structural word-level ATPG and a modular arithmetic constraint solver. The word-level ATPG decision-making process is confined to the selected control signals. Thus, the enumeration of an enormous number of choices at the datapath signals is avoided.

Another technical advantage of the present invention includes providing ATPG implication translation techniques that enable word-level logic implementation to be performed across the boundary between the control logic and the datapath portion of the circuit. Thus, ATPG search space is effectively reduced.

Another technical advantage includes providing a modular arithmetic constraint solver. The modular arithmetic constraint solver is based on a modular number system instead of an integral number system. Thus, using the modular arithmetic constraint solver avoids or prevents the false-negative effect that can result from bit-vector value modulation.

This invention may be provided in other specific forms and embodiments without departing from the essential characteristics as described herein. The embodiments described above are to be considered in all aspects as illustrative only and not restrictive in any manner. The following claims rather than the foregoing description indicate the scope of the invention.

Appendix A

Appendix A provides certain theoretic details of the modular constraint solver. The modular constraint solver is capable of finding all solutions to a given set of linear constraints under modular number system and expressing them in a closed form.

Definition 3 (Multiplicative Inverse of Bit-Vector): The multiplicative inverse x of an n-bit bit-vector a is defined as $\{x|(a*x) \text{ modulo } 2^n=1\}$, and denoted as multiplicative_inverse(a).

Note that while multiplicative inverse exists for every nonzero real number, in integral number domain only integers 1 and −1 have multiplicative inverses. In modulo-$2_n$ number system, only odd numbers have one and only one multiplicative inverse. For example, for 3-bit-wide bit-vectors, 3 is 3's multiplicative inverse because 3*3=9 and 9 modulo $2^3$=1. On the other hand, 2 does not have any multiplicative inverses. Although no multiplicative inverse exists for even bit-vectors, the concept of multiplicative inverse can be extended to the multiplicative inverse with product k.

Definition 4 (Multiplicative Inverse of Bit-Vector With Product k): The multiplicative inverse x of an n-bit bit-vector a with multiplication product k is defined as $\{x|(a*x) \text{ modulo } 2^n=k\}$, and denoted as multiplicative_inverse$_k$(a).

For example, for 3-bit-wide bit-vectors, 3 is 6's multiplicative inverse with product 2 because 6*3=18 and 18 modulo $2^3$=2. Moreover, 0 does not have any multiplicative inverse with nonzero product, but every bit-vector is a multiplicative inverse of 0 with product 0.

As for the linear constraint example above, modulating the equation with $2^3$ produces:

$$\begin{bmatrix} 1 & 1 \\ 0 & 5 \end{bmatrix} \cdot \begin{bmatrix} x \\ y \end{bmatrix} = \begin{bmatrix} 5 \\ 2 \end{bmatrix}$$

Solving the second row by multiplicative_inverse$_2$(5) results in y=2. Substituting it back to the first row derives x=3.

A bit-vector may have none or several multiplicative inverses. The following theorem gives the number of multiplicative inverses for a given bit-vector.

Theorem 1: Given a nonzero n-bit-wide bit-vector a with greatest odd factor a', it can be expressed as a=a'*2$^m$, where m is an integer.

(T1.1) a has exactly one multiplicative inverse with product k if and only if a is an odd number; that is, m=0. Moreover, multiplicative_inverse$_k$(a)=multiplicative_inverse(a)*k.

(T1.2) a has no multiplicative inverse with product k if and only if a is an even number and k is not a multiple of 2$^m$.

(T1.3) a has exactly 2$^m$ multiplicative inverses with product k if and only if a is an even number and k is a multiple of 2$^m$.

For example, for 3-bit-wide bit-vectors, 6(=3*2$^1$) has no multiplicative inverse with product 3 because 3 is not a multiple of 2$^1$, but has exactly two multiplicative inverses of product 4 as {2, 6}. Furthermore, all the 2$^m$ multiplicative inverse bit-vectors in (T1.3) can be represented in a closed form as shown in the following theorem.

Theorem 2: Given a nonzero even n-bit-wide bit-vector a with the greatest odd factor a', it can be expressed as a=a'*2$^m$. If k is a multiple of 2$^m$ as k=k'*2$^m$ and b is the only multiplicative inverse of a' with product k', that is, (a'*b) modulo 2$^n$=k', then the multiplicative inverse of a with product k can be represented in the following closed form:

multiplicative_inverse$_k$(a)=(b+2$^{(n-m)}$·t) modulo 2$^n$ where t is a free integer between 0 and 2$^m$−1.

For example, for 4-bit-wide bit-vectors, let a=6=3*2$^1$ and k=10=5*2$^1$, which is a multiple of 2. By (T1.3), it can be determined that a=6 has exactly two multiplicative inverses with product k=10. Because the multiplicative inverse of 3 with product 5 is 7 (3*7=21 modulo 2$^4$=5), all the multiplicative inverses of 6 with product 10 can be presented as "7+2$^3$*t", for t=0 or 1.

The concept of multiplicative inverse is extended and applied to solve the linear bit-vector matrix constraints using the Gauss-Jordan elimination method. For the linear equation A*x=b, the solutions can be represented in a closed form as x=N·f+x$_0$ where N null matrix (because multiplying it with the constraint matrix A will result in a zero matrix);

f column matrix containing some free variables;

x$_0$ solution and can be derived from A, N and b in linear time.

Applying different values of the free variables in f, different values of x is obtained, each of which is a solution of A*x=b.

EXAMPLE

The detailed procedure of the linear constraint-solving algorithm is illustrated using the following linear circuit example:

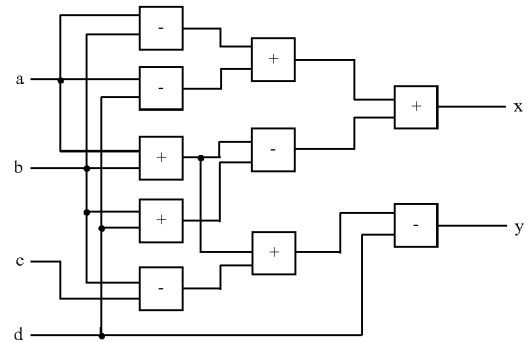

Assume all the signal buses of the above linear circuit example are 4-bits wide and the initial assignments for output x=2 and y=10 are given. The linear constraints can be expressed as an integer matrix equation:

$$\begin{bmatrix} 3 & -1 & 0 & -2 \\ 1 & 2 & -2 & 0 \end{bmatrix} \cdot \begin{bmatrix} a \\ b \\ c \\ d \end{bmatrix} = \begin{bmatrix} 2 \\ 10 \end{bmatrix}$$

Modulating the coefficients by 16(2$^4$) produces:

$$\begin{bmatrix} 3 & 15 & 0 & 14 \\ 1 & 2 & 14 & 0 \end{bmatrix} \cdot \begin{bmatrix} a \\ b \\ c \\ d \end{bmatrix} = \begin{bmatrix} 2 \\ 10 \end{bmatrix}$$

First, a (series of) row operation(s) is performed to upper-trianglize the matrix; that is, make its lower-left element(s) 0. Here, the first row of the above example is multiplied by the multiplicative inverse of its first element (i.e., multiplicative_inverse(3) 11) and subtracted from the second row. The equation then becomes:

$$\begin{bmatrix} 3 & 15 & 0 & 14 \\ 0 & 13 & 14 & 6 \end{bmatrix} \cdot \begin{bmatrix} a \\ b \\ c \\ d \end{bmatrix} = \begin{bmatrix} 2 \\ 4 \end{bmatrix}$$

The partial solution for the last nonzero row is then solved. To obtain a particular solution for a single-row equation, a check to determine if the greatest common divisor (gcd) of this row has a multiplicative inverse with product of the constant vector on the right-hand side is performed. If the multiplicative inverse does not exist, there will be no solution for this row and, therefore, no solution for the entire matrix equation. For the above example, the gcd for the last nonzero row {13, 14, 6} is equal to one, which has a multiplicative inverse with product 4. All but one variable (b and c) is set to zeros and the value of d equal to multiplirative_inverse$_4$(6)=6 is derived. Therefore, a particular solution for the last row is:

$$\begin{bmatrix} b \\ c \\ d \end{bmatrix} = \begin{bmatrix} 0 \\ 0 \\ 6 \end{bmatrix}$$

The next step is to obtain the null matrix for this single nonzero row matrix. For a row matrix with k nonzero elements, solving its null matrix is equivalent to finding (k−1) linearly independent column matrices and each of the column matrices can produce a zero matrix by multiplying it with the row matrix. These (k−1) linearly independent column matrices can be generated by selecting (k−1) pairs of nonzero elements in the row matrix and for each pair, the multiplicative inverse of one element with product as negation of the other is solved. For the last row in the above example, two pairs of nonzero bit-vectors: (13, 14) and (14, 6) are selected. Finding the multiplicative inverse generates multiplicative_inverse$_{13}$(−14)=10 and multiplicative_inverse$_{14}$(−6)=3. The null matrix is obtained by assigning each column with an element equal to the multiplicative inverse and the other element to one.

For the above example, the null matrix for the last row is:

$$N_1 = \begin{bmatrix} 10 & 0 \\ 1 & 3 \\ 0 & 1 \end{bmatrix}$$

Therefore, a partial solution set for variables (b, c, d) is:

$$\begin{bmatrix} b \\ c \\ d \end{bmatrix} = \begin{bmatrix} 10 & 0 \\ 1 & 3 \\ 0 & 1 \end{bmatrix} \cdot \begin{bmatrix} i \\ j \end{bmatrix} + \begin{bmatrix} 0 \\ 0 \\ 6 \end{bmatrix}$$

where i and j are free variables between 0 and 15.

Once the partial solution set for the last row is generated, the corresponding variables in the next nonzero row can be substituted with the solution and the solution set cab be refined to satisfy the last two nonzero rows of A. This process is iterated until the first row is reached. This results in the following closed form solution for the entire linear constraints:

$$3a + \begin{bmatrix} 15 & 0 & 14 \end{bmatrix} \cdot \left( \begin{bmatrix} 10 & 0 \\ 1 & 3 \\ 0 & 1 \end{bmatrix} \cdot \begin{bmatrix} i \\ j \end{bmatrix} + \begin{bmatrix} 0 \\ 0 \\ 6 \end{bmatrix} \right) =$$

$$2 \Rightarrow \begin{bmatrix} a \\ b \\ c \\ d \end{bmatrix} = \begin{bmatrix} 14 & 6 \\ 10 & 0 \\ 1 & 3 \\ 0 & 1 \end{bmatrix} \cdot \begin{bmatrix} i \\ j \end{bmatrix} + \begin{bmatrix} 10 \\ 0 \\ 0 \\ 6 \end{bmatrix}$$

Appendix B

Appendix B provides an exemplary procedure that can be utilized by the modular constraint solver to solve linear equations having bit slicing and concatenation operations. The procedure involves enumeration of some of the variables and applies the constraint implication to screen out the illegal set of solutions.

As an example, consider the following linear constraints in the matrix format:

$$\begin{bmatrix} 4 & 4 & 5 & 4 \\ 3 & 9 & 14 & 5 \end{bmatrix} \cdot \begin{bmatrix} a \\ b \\ c \\ d \end{bmatrix} = \begin{bmatrix} 9 \\ 11 \end{bmatrix}$$

Furthermore, the input variables a, b, c, and d are 1-, 2-, 3-, and 4-bit wide, respectively, and are the bit-sliced signals of some variables. Moving the variables a and b to the right-hand side creates the following:

$$\begin{bmatrix} 5 & 4 \\ 14 & 5 \end{bmatrix} \cdot \begin{bmatrix} c \\ d \end{bmatrix} = \begin{bmatrix} 12 & 12 & 9 \\ 13 & 7 & 11 \end{bmatrix} \cdot \begin{bmatrix} a \\ b \\ 1 \end{bmatrix}$$

Multiplying both sides of the above equation with the inverse matrix of $$\begin{bmatrix} 5 & 4 \\ 14 & 5 \end{bmatrix}$$

to obtain a constraint of c and d in terms of inputs a and b as:

$$\begin{bmatrix} c \\ d \end{bmatrix} = \begin{bmatrix} 5 & 2 \\ 12 & 5 \end{bmatrix} \cdot \begin{bmatrix} 12 & 12 & 9 \\ 13 & 7 & 11 \end{bmatrix} \cdot \begin{bmatrix} a \\ b \\ 1 \end{bmatrix}$$

$$= \begin{bmatrix} 6 & 2 & 3 \\ 1 & 3 & 3 \end{bmatrix} \cdot \begin{bmatrix} a \\ b \\ 1 \end{bmatrix}$$

After the above transformation, the modular constraint solver can express the variables with larger domains (e.g., c and d with 3- and 4-bit wide) in terms of those with smaller domains (e.g., a and b with 1- and 2-bit wide). In the decision making process, the modular constraint solver can then enumerate the variable with a smaller number of choices followed by implications using the above equation to check if the nonlinear constraints are satisfiable. In the above example, the modular constraint solver can determine that if a=1, then c=2*b+9, which will always be greater than 8 and, thus, contradicts its domain constraint (i.e., c is 3-bit wide and, thus, 0≦c≦7). Therefore, it is necessary to have a=0, which results in the following four solutions: {a,b,c,d| (0, 0, 1, 9), (0, 1, 1,4), (0,2, 1, 15), (0,3, 1, 10)}.

The invention claimed is:

1. A method for performing assertion checking for functional verification of circuits comprising:
   providing a representation of a circuit, the representation comprising a control logic component and a datapath logic component;
   reading one or more vector generation targets;

performing word-level ATPG justification on the control logic component to obtain a control logic solution;

extracting one or more arithmetic functions for the datapath logic component based on the control logic solution; and solving the one or more arithmetic functions using a modular constraint solver, the modular constraint solver being based on a modular number system.

2. The method of claim 1, wherein the word-level ATPG justification comprises performing word-level implication on circuit components related to the one or more vector generation targets.

3. The method of claim 1, wherein solving the one or more arithmetic functions comprises:

determining possible solutions for one or more nonlinear equations; and solving one or more linear equations using one possible solution for the one or more nonlinear equations as boundary conditions.

4. The method of claim 1 further comprising:

dependent on the outcome of solving the one or more arithmetic functions, backtracking to perform word-level ATPG justification on the control logic component to obtain a second control logic solution;

extracting one or more arithmetic functions for the datapath logic component based on the second control logic solution; and solving the one or more arithmetic functions using the modular constraint solver.

5. The method of claim 1, wherein at least one vector generation target comprises a signal value.

6. The method of claim 1, wherein at least one vector generation target comprises a relation among a set of signals.

7. The method of claim 1, wherein at least one vector generation target comprises a sequence of relations among a set of signals.

8. A computer-readable storage medium having stored thereon computer instructions that, when executed by a computer, cause the computer to:

provide a representation of a circuit, the representation comprising a control logic component and a datapath logic component;

read one or more vector generation targets;

perform word-level ATPG justification on the control logic component to obtain a control logic solution;

extract one or more arithmetic functions for the datapath logic component based on the control logic solution; and solve the one or more arithmetic functions using a modular constraint solver, the modular constraint solver being based on a modular number system.

9. The computer-readable storage medium of claim 8, wherein the computer instructions that perform word-level ATPG justification further comprise computer instructions that, when executed by a computer, cause the computer to perform word-level implication on circuit components related to the one or more vector generation targets.

10. The computer-readable storage medium of claim 8, wherein the computer instructions that solve the one or more arithmetic functions further comprise computer instructions that, when executed by a computer, cause the computer to:

determine possible solutions for one or more nonlinear equations; and solve one or more linear equations using one possible solution for the one or more nonlinear equations as boundary conditions.

11. The computer-readable storage medium of claim 8, wherein the computer instructions that solve the one or more arithmetic functions further comprise computer instructions that, when executed by a computer, cause the computer to:

dependent on the outcome of solving the one or more arithmetic functions, backtrack to perform word-level ATPG justification on the control logic component to obtain a second control logic solution;

extract one or more arithmetic functions for the datapath logic component based on the second control logic solution; and solve the one or more arithmetic functions using the modular constraint solver.

12. The computer-readable storage medium of claim 8, wherein at least one vector generation target comprises a signal value.

13. The computer-readable storage medium of claim 8, wherein at least one vector generation target comprises a relation among a set of signals.

14. The computer-readable storage medium of claim 8, wherein at least one vector generation target comprises a sequence of relations among a set of signals.

15. The computer-readable storage medium of claim 8, wherein the word-level ATPG justification is performed by performing a word-level implication, the word-level implication comprising a decision on at least one control signal.

16. The computer-readable storage medium of claim 15, wherein the word-level implication is performed on the at least one control signal.

17. The computer-readable storage medium of claim 8, further comprising computer instructions that, when executed by a computer, cause the computer to:

extract one or more arithmetic functions based on the ATPG justification; and solve the one or more arithmetic functions using the modular constraint solver.

18. A system for performing assertion checking for functional verification of circuits comprising:

means for providing a representation of a circuit, the representation comprising a control logic component and a datapath logic component;

means for reading one or more vector generation targets;

means for performing word-level ATPG justification on the control logic component to obtain a control logic solution;

means for extracting one or more arithmetic functions for the datapath logic component based on the control logic solution; and means for solving the one or more arithmetic functions using a modular constraint solver, the modular constraint solver being based on a modular number system.

19. The system of claim 18, wherein the means for performing the word-level ATPG justification comprises means for performing word-level implication on circuit components related to the one or more targets.

20. The system of claim 18, wherein the means for solving the one or more arithmetic functions comprises:

means for determining possible solutions for one or more nonlinear equations; and means for solving one or more linear equations using one possible solution for the one or more nonlinear equations as boundary conditions.

21. The system of claim 18, further comprising:

dependent on the outcome of solving the one or more arithmetic functions, means for backtracking to perform word-level ATPG justification on the control logic component to obtain a second control logic solution;

means for extracting one or more arithmetic functions for the datapath logic component based on the second control logic solution; and means for solving the one or more arithmetic functions using the modular constraint solver.

22. The method of claim 18, wherein at least one vector generation target comprises a signal value.

23. The method of claim 18, wherein at least one vector generation target comprises a relation among a set of signals.

24. The method of claim 18, wherein at least one vector generation target comprises a sequence of relations among a set of signals.

* * * * *